(12) United States Patent
Shimada et al.

(10) Patent No.: US 9,966,921 B2
(45) Date of Patent: *May 8, 2018

(54) MULTI-BAND LIMITER, SOUND RECORDING APPARATUS, AND PROGRAM STORAGE MEDIUM

(71) Applicant: TEAC CORPORATION, Tokyo (JP)

(72) Inventors: Hirotoshi Shimada, Tokyo (JP); Shigeyuki Adachi, Tokyo (JP)

(73) Assignee: TEAC Corporation, Tokyo (JP)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/333,885

(22) Filed: Oct. 25, 2016

(65) Prior Publication Data

US 2017/0117864 A1 Apr. 27, 2017

(30) Foreign Application Priority Data

Oct. 27, 2015 (JP) ................................. 2015-211308

(51) Int. Cl.
| | |
|---|---|
| *H03G 5/00* | (2006.01) |
| *H03G 11/00* | (2006.01) |
| *H04R 3/04* | (2006.01) |
| *H04R 3/14* | (2006.01) |

(52) U.S. Cl.
CPC ............ *H03G 11/008* (2013.01); *H04R 3/04* (2013.01); *H04R 3/14* (2013.01)

(58) Field of Classification Search
CPC . H04R 3/04; H04R 3/14; H03G 5/165; H03G 5/025

USPC ...................................................... 381/98–99
See application file for complete search history.

(56) References Cited

U.S. PATENT DOCUMENTS

| | | | | |
|---|---|---|---|---|
| 8,924,220 | B2* | 12/2014 | Hosokawa | H03G 9/025 341/50 |
| 9,307,323 | B2* | 4/2016 | Risberg | H04R 3/04 |
| 9,385,679 | B1* | 7/2016 | Polleros | H03G 3/00 |
| 2011/0110533 | A1* | 5/2011 | Choi | H03G 9/005 381/99 |
| 2012/0209616 | A1 | 8/2012 | Hosokawa | |
| 2014/0379355 | A1 | 12/2014 | Hosokawa | |

FOREIGN PATENT DOCUMENTS

WO 2011048741 A1 4/2011

\* cited by examiner

*Primary Examiner* — Disler Paul
(74) *Attorney, Agent, or Firm* — Seed Intellectual Property Law Group LLP

(57) ABSTRACT

A multi-band limiter, a sound recording apparatus, and a program are provided having a multi-band limit function with a flat frequency characteristic while removing a dead zone of the multi-band limiter. A multi-band limiter is provided including an overlap filter unit (200) that divides an input sound signal into low-band, middle-band, and high-band components such that the components overlap each other between adjacent bands, limiters (202, 204, 208, 210, 214, 216) that apply a limit process to limit a level in each band, trimming filter units (206, 212, 218) that apply a trimming process to trim an overlapping signal component in each of the limit-processed components, and an adder (220) that combines and outputs the trimming-processed components.

5 Claims, 5 Drawing Sheets

MULTI-BAND LIMITER, SOUND RECORDING APPARATUS, AND PROGRAM STORAGE MEDIUM

CROSS REFERENCE TO RELATED APPLICATION

The entire disclosure of Japanese Patent Application No. 2015-211308 filed on Oct. 27, 2015 including the specification, claims, drawings, and abstract is incorporated herein by reference in its entirety.

TECHNICAL FIELD

The present disclosure relates to a multi-band limiter, a sound recording apparatus, and a program storage medium.

BACKGROUND

In order to record an input sound properly, a limiter for the input sound is an important function. A normal limiter operates with respect to all frequency bands of the sound to be recorded. Thus, for example, even when a peak is detected at a frequency band different from the frequency band of the sound desired to be recorded, gain reduction is executed for all frequency bands. Because of this, sound in the frequency band of the sound it is desired to record is also reduced.

As a countermeasure in such a case, a multi-band limiter is being proposed. In a multi-band limiter, the whole frequency band is divided into a plurality of bands, and a limit process is executed independently for each frequency band, so that the gain reduction due to an instantaneous peak in a certain frequency band does not affect other frequency bands.

WO 2011/048741 discloses a multi-band compressor, and describes that, in a typical multi-band compressor of the related art, compressors of the frequency bands operate independently from each other, and that, in order to solve the problem associated with the independent operation, a gain value is calculated from a signal level calculated in each frequency band, and the gain value used for a compression process is limited by comparing the gain values calculated at various frequency bands.

One problem associated with the multi-band limiter is a slope of a filter when the frequency band is divided. Filters for cutting out adjacent frequency bands are normally set to cross at −6 dB (hereinafter referred to as "cross-over filter"), so that the frequency characteristic becomes flat after the divided frequency bands are combined.

However, in the filter process with such a cross-over filter, a band in which the filter is not applied, which is also called a dead zone, occurs in frequency bands above and below the crossed frequency. Specifically, in this zone, originally, even for a signal having a level exceeding a threshold, and for which the gain should be reduced because the level of the input sound is attenuated by the filter, the signal level after the attenuation becomes less than or equal to the threshold and the gain cannot be reduced. In addition, when the slope of the filter is not steep, signals of the same frequency would exist in both adjacent frequency bands, and in this case, the limiter is applied to one signal but not to the other. Consequently, when the signals are added in the combining process, a frequency band in which the limiter is not applied is generated, and the dead zone may be further widened.

FIGS. 4A and 4B show a frequency characteristic of a multi-band limiter of the related art. The frequency bands are divided into three bands, LOW, MIDDLE, and HIGH, the signals are divided with the filters of these bands crossing at −6 dB (FIG. 4A), the limit process is executed for each band (FIG. 4B), and the signals of the bands are added and combined. In other words, the flow is:

frequency band division (−6 dB cross)→limit process for each band→combining.

However, because the signal is attenuated in the frequency band near adjacent frequency bands as shown in FIG. 4A, a signal which should be limited by the threshold, that is, the limiter level, is not limited, and the limiter is not applied. FIG. 4B shows the dead zone of the limiter thus created. When the dead zone of the filter appears, if there is a peak level of the sound volume in this portion, the peak level cannot be limited, and sound recording failure may result due to overpeak of the sound volume.

SUMMARY

An advantage of the present disclosure lies in provision of a multi-band limiter, a sound recording apparatus, and a program storage medium having a multi-limit function with a flat frequency characteristic, while removing the dead zone of the multi-band limiter.

According to one aspect of the present disclosure, there is provided a multi-band limiter comprising: a divider that includes a first filter element that divides an input sound signal into at least a first component which is of a relatively low band and a second filter element that divides the input sound signal into a second component which is of a relatively high band, and that divides the input sound signal in a such manner that the first component and the second component overlap each other by setting a high-band side cutoff frequency of the first filter element to be greater than or equal to a low-band side cutoff frequency of the second filter element; a limiter that applies a limit process to limit a level in each of the first component and the second component; a trimmer that applies a trimming process to trim an overlapping signal component in each of the limit-processed first component and the limit-processed second component; and a combiner that combines and outputs the trimming-processed first component and the trimming-processed second component.

According to another aspect of the present disclosure, the divider includes a low-band filter element, a middle-band filter element, and a high-band filter element that respectively divide the input sound signal into a low-band component, a middle-band component, and a high-band component, and divides the input sound signal in such a manner that the low-band component and the middle-band component overlap each other and the middle-band component and the high-band component overlap each other by setting a high-band side cutoff frequency of the low-band filter element to be greater than or equal to a low-band side cutoff frequency of the middle-band filter element and setting a high-band side cutoff frequency of the middle-band filter element to be greater than or equal to a low-band side cutoff frequency of the high-band filter element, the limiter limits the level in each of the low-band component, the middle-band component, and the high-band component, the trimmer trims overlapping signal components in each of the limit-processed low-band component, the limit-processed middle-band component, and the limit-processed high-band component, and the combiner combines and outputs the trimming-processed low-band component, the trimming-processed middle-band component, and the trimming-processed high-band component.

According to another aspect of the present disclosure, the trimmer applies the trimming process so that adjacent components after the trimming process cross each other at −6 dB.

According to another aspect of the present disclosure, there is provided a sound recording apparatus comprising: the above-described multi-band limiter; and a recorder that records an output signal from the multi-band limiter.

According to another aspect of the present disclosure, there is provided a program storage medium that stores a program which, when executed, causes a processor of a computer to function as: a divider that includes a first filter element that divides an input sound signal into at least a first component which is of a relatively low band, and a second filter element that divides the input sound signal into a second component which is of a relatively high band, and that divides the input sound signal in such a manner that the first component and the second component overlap each other by setting a high-band side cutoff frequency of the first filter element to be greater than or equal to a low-band side cutoff frequency of the second filter element; a limiter that applies a limit process to limit a level in each of the first component and the second component; a trimmer that applies a trimming process to trim an overlapping signal component in each of the limit-processed first component and the limit-processed second component; and a combiner that combines and outputs the trimming-processed first component and the trimming-processed second component.

According to various aspects of the present disclosure, a multi-band limiter, a sound recording apparatus, and a program can be obtained having a multi-band limit function with a flat frequency characteristic while removing a dead zone. According to various aspects of the present disclosure, in field recording or the like, for example, sound to be recorded can be clearly recorded while preventing failure of sound recording due to overpeak of the sound volume level.

BRIEF DESCRIPTION OF DRAWINGS

Embodiment(s) of the present disclosure will be described based on the following figures, wherein.

DESCRIPTION OF EMBODIMENTS

Figure 1:
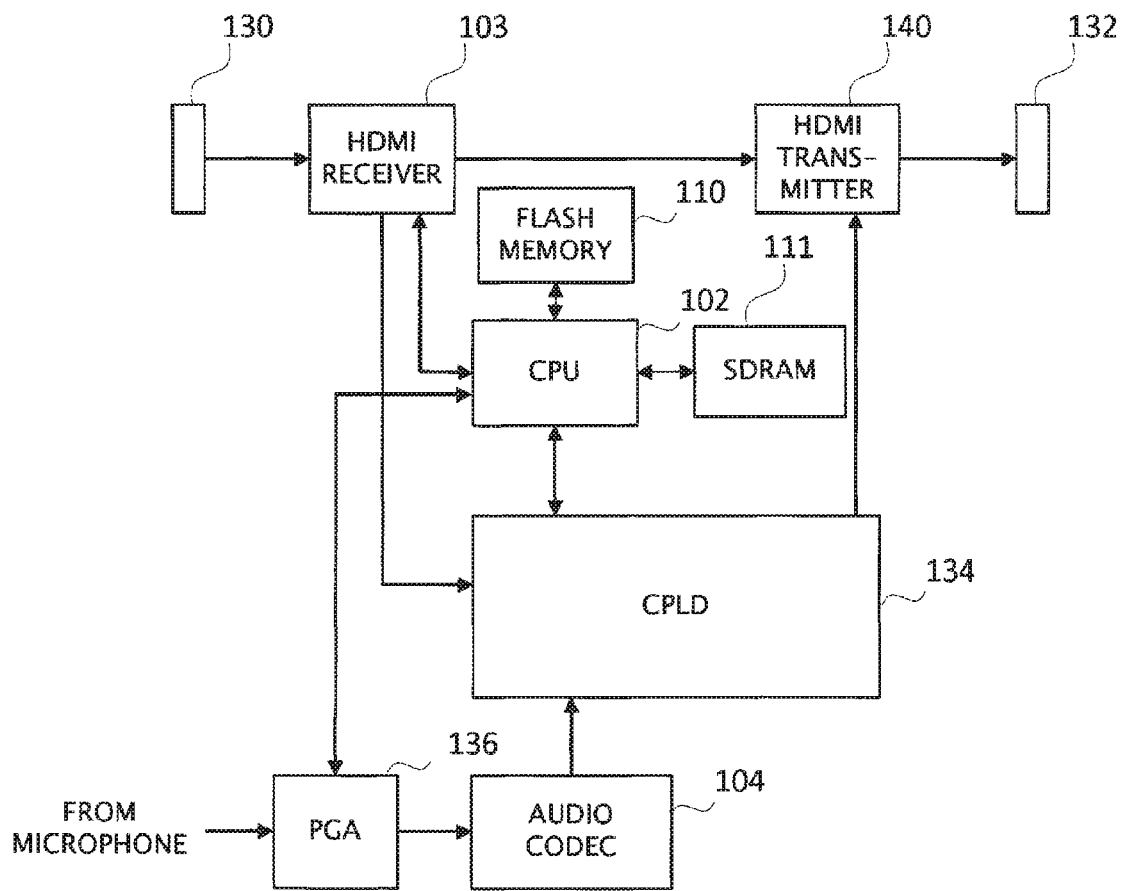
FIG. 1 is an overall structural block diagram of an embodiment of the present disclosure.

An embodiment of the present disclosure will now be described with reference to the drawings. The embodiment is merely exemplary, and the present disclosure is not limited to the following embodiment.

<Basic Principle>

First, a basic principle of an embodiment of the present disclosure will be described.

As already described, in general, in a multi-band limiter, the filters which cut out adjacent frequency bands are set to cross with −6 dB. Specifically, in each frequency band, the signal is attenuated by 6 dB to reach the cross point, so that after the signals of the frequency bands that are divided are combined, the frequency characteristic is approximately flat (it is known that, with an amount of attenuation of −6 dB in each of the high-pass and low-pass cross points, a superior overall characteristic can be achieved and the outputs of the high-pass side and the low-pass side at the cross frequency can be set in the same phase). On the other hand, a dead zone in which the filter is not applied may occur when crossing at −6 dB. This is true for a 2-way cross-over in which the input sound signal is divided into two bands and also for a 3-way cross-over in which the input sound signal is divided into three bands.

In consideration of this, in the present embodiment, as the filter for dividing into the plurality of frequency bands, a filter that overlaps between adjacent frequency bands (hereinafter also referred to as "overlap filter") is used for dividing (extracting) the signal in place of the cross-over filter which crosses at −6 dB. Specifically, the filter has a first filter element which divides an input sound signal into at least a first component which is of a relatively low band and a second filter element which divides the input sound signal into a second component which is of a relatively high band, and divides the input sound signal in such a manner that the first component and the second component overlap each other, by setting a high-band side cutoff frequency of the first filter element to be greater than or equal to a low-band side cutoff frequency of the second filter element. Alternatively, the number of frequency bands to be divided may be set to be greater than 2, and when the input sound signal is to be divided into three bands, the filter may include a low-band filter element, a middle-band filter element, and a high-band filter element which respectively divide the input sound signal into a low-band component, a middle-band component, and a high-band component, and divides the input sound signal in such a manner that the low-band component and the middle-band component overlap each other and the middle-band component and the high-band component overlap each other, by setting a high-band side cutoff frequency of the low-band filter element to be greater than or equal to a low-band side cutoff frequency of the middle-band filter element and a high-band side cutoff frequency of the middle-band filter element to be greater than or equal to a low-band side cutoff frequency of the high-band filter element.

After a limit process is executed for each frequency band, a trimming filter process to remove the frequency bands that overlap each other is applied, and the signals of the frequency bands are then combined. With the use of the filter in which the adjacent frequency bands overlap each other, it is possible to avoid a problem that the limit process is not applied due to the attenuation of the signals in the frequency bands. However, in this case, if the signals of the frequency bands are added and combined without any further processing, the signal level of the overlapped portion would be increased, and thus, the signal in the overlap portion is removed by a trimming filter before the signals of the frequency bands are combined, to achieve a flat frequency characteristic.

As described, by combining the overlap filter and the trimming filter, it becomes possible to realize a multi-band limit function having a flat frequency characteristic while removing the dead zone.

When the multi-band limiter is used in editing or the like after sound recording, because the characteristic of the input sound is known in advance, it may be possible to avoid the influence of the dead zone by employing a design so that the crossing frequency can be changed by the user. However, at the recording site such as with, for example, field sound recording, because the characteristic of the input sound is not known in advance, it is not possible to set the crossing frequency in advance. The present embodiment is not particularly limited to this configuration, but is especially effective when the characteristic of the input sound is not known in advance such as in the case of field sound recording or the like.

<Structure>

Next, a specific structure of a sound recording apparatus according to the present embodiment will be described exemplifying a sound recording apparatus having an HDMI (registered trademark) terminal. It should be noted that the HDMI terminal is not an indispensable structural element in the present disclosure.

The sound recording apparatus is a PCM recorder, and records a sound signal in a linear PCM:WAV format which does not irreversibly compress the sound signal. Alternatively, the apparatus may correspond to an irreversible compression format such as MP3. The sound recording apparatus receives a video signal included in an HDMI signal from a camera which is HDMI-connected, for example, and with regard to the video signal, serves as an HDMI repeater device to output the video signal to a backup video recording device or the like which is HDMI-connected, without any processing. On the other hand, the sound recording apparatus converts an analog audio signal which is input from a microphone which is connected to the apparatus into a digital signal, embeds the signal in an audio CH of an HDMI signal from the camera, and outputs the signal to the backup video recording device or the like which is HDMI-connected.

The backup video recording device receives, from the sound recording apparatus which is HDMI-connected, the video signal captured by the camera and the audio signal recorded by the sound recording apparatus, both through the HDMI. Even if the backup video recording apparatus only has an analog sound input terminal as the sound input terminal, a high-quality audio signal can be input from the HDMI input terminal.

FIG. 1 is an overall structural block diagram of the sound recording apparatus. The sound recording apparatus comprises an HDMI input terminal (HDMI IN) 130, an HDMI output terminal (HDMI OUT) 132, an HDMI receiver 103, an HDMI transmitter 140, a CPU 102, a CPLD (Complex Programmable Logic Device) 134, an audio CODEC 104, and a PGA (Programmable Gain Amplifier) 136.

The HDMI input terminal 130 is connected to the camera via an HDMI cable.

The HDMI receiver 103 outputs an LRCK signal, a BCLK (or SCLK) signal, a data signal, and an MCLK signal based on a TMDS signal and a TMDS clock signal transmitted from the camera via the HDMI cable. The CPU 102 is connected to the HDMI receiver 103 through an I2C bus, and the CPU 102 controls an operation of the HDMI receiver 103. The HDMI receiver 103 serves as an HDMI repeater device, and outputs the video signal included in the data signal without any further processing to the HDMI transmitter 140. On the other hand, the HDMI receiver 103 supplies the audio signal included in the data signal to the CPLD 134. The CPLD 134 receives the audio signal which is output from the HDMI receiver 103, and inputs the signal to a multiplexer (MUX) 136, and also outputs the signal to the CPU 102.

On the other hand, the analog audio signal which is input from the microphone is gain-adjusted by the PGA 136, converted into a digital signal by the audio CODEC 104, and supplied to the CPLD 134. The gain of the PGA 136 is controlled by the CPU 102. The CPLD 134 supplies the analog audio signal which is input from the microphone to the CPU 102, applies a multi-band limit process using the CPU 102, and records the sound, and in addition, applies an embedding process to the audio signal from the HDMI receiver 103 as necessary. The embedded (multiplexed) signal is output to the HDMI transmitter 140. The HDMI transmitter 140 supplies the video signal from the HDMI receiver 103 and the audio signal to which the microphone audio signal is embedded in the CPLD 134 to the HDMI output terminal 132.

In the following, a process will be described in which the audio signal which is input from the microphone and converted into a digital signal is processed by the CPU 102 (including the multi-band limit process), and is recorded as audio data on a semiconductor memory such as an SD card memory.

The CPU 102 reads out a process program and executes the multi-band limit process using a flash memory 110 and an SDRAM 111 respectively as a program memory and a working memory. The CPU 102 records the sound by recording the processed audio data in the flash memory 110 or in an SD card memory equipped on an SD card connector (not shown).

Figure 2:
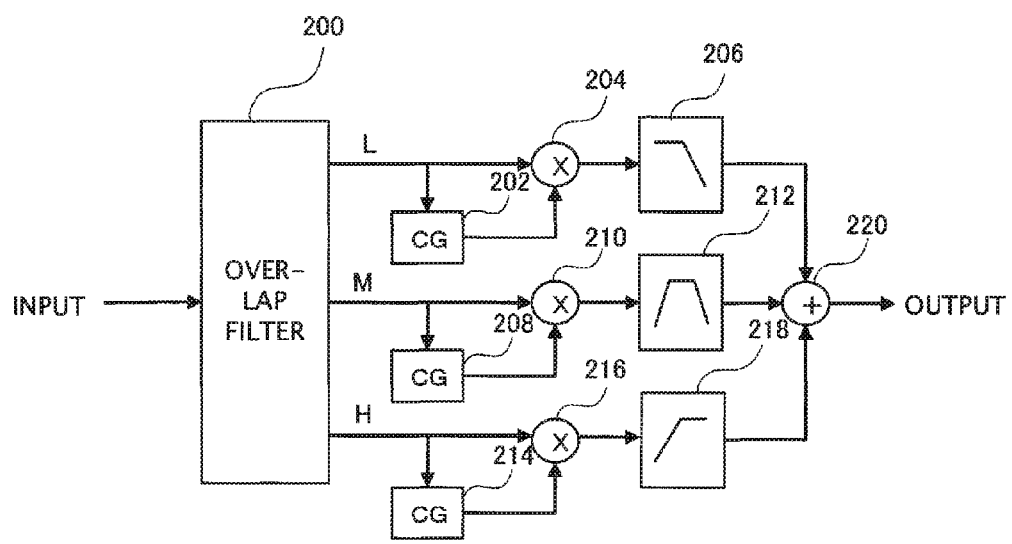
FIG. 2 is a functional block diagram of a multi-band limiter according to an embodiment of the present disclosure.

FIG. 2 is a functional block diagram of a multi-band limit process realized by the CPU 102 executing the process program. Thus, the functions of FIG. 2 are not realized by specific hardware circuits, but by the CPU 102 executing respective functional modules of the process program.

The multi-band limit function includes an overlap filter unit 200, control gains (CGs) 202, 208, and 214, multipliers 204, 210, and 216, trimming filter units 206, 212, and 218, and an adder 220.

The CG 202, the multiplier 204, and the trimming filter unit 206 form a low-band (L) processor; the CG 208, the multiplier 210, and the trimming filter unit 212 form a middle-band (M) processor; and the CG 214, the multiplier 216, and the trimming filter unit 218 form a high-band (H) processor. The CGs 202, 208, and 214 and the multipliers 204, 210, and 216 form a limiter unit. The input sound is divided into three frequency bands including a low band, a middle band, and a high band by the overlap filter unit 200, a limit process is executed by the limiter unit on respective bands, a trimming process is executed by the trimming filter units 206, 212, and 218, and the signals of the three frequency bands are combined by the adder 220.

The overlap filter unit 200 is a filter unit for dividing the input sound into the low band, the middle band, and the high band, and has a filter characteristic in which the adjacent frequency bands overlap each other, rather than a filter characteristic of crossing at −6 dB as in the related art. The input sound is divided into a low-band component, a middle-band component, and a high-band component by the overlap filter unit 200.

The CG 202 sets a control gain based on the low-band component, and outputs the gain to the multiplier 204. Specifically, the CG 202 compares the signal level of the low-band component with a threshold, and sets a lower gain coefficient in order to limit the signal level when the signal level exceeds the threshold, and outputs the set gain coefficient to the multiplier 204.

The multiplier 204 multiplies the low-band component by the control gain coefficient from the CG 202, to limit the level of the low-band component, and operates as a low-band limiter.

The CG 208 sets a control gain based on the middle-band component, and outputs the set control gain to the multiplier 210. Specifically, the CG 208 compares the signal level of the middle-band component with a threshold, sets a lower gain coefficient to limit the signal level when the signal level exceeds the threshold, and outputs the set gain coefficient to the multiplier 210.

The multiplier 210 multiplies the middle-band component by the control gain coefficient from the CG 208 to limit the level of the middle-band component, and operates as a middle-band limiter.

The CG 214 sets a control gain based on the high-band component, and outputs the set control gain to the multiplier 216. Specifically, the CG 214 compares the signal level of the high-band component with a threshold, sets a lower gain coefficient to limit the signal level when the signal level exceeds the threshold, and outputs the set gain coefficient to the multiplier 216.

The multiplier 216 multiplies the high-band component by the control gain coefficient from the CG 214 to limit the level of the high-band component, and operates as a high-band limiter.

The limit-processed low-band component from the multiplier 204, the limit-processed middle-band component from the multiplier 210, and the limit-processed high-band component from the multiplier 216 are combined in the adder 220, but without any further processing the levels of the overlapped portions would be increased, and the frequency characteristic would not be flat.

In consideration of this, for the signal components limit-processed at respective bands, the signal components of the overlapped portions are removed by the trimming filter units 206, 212, and 218, respectively.

Specifically, the trimming filter unit 206 removes the overlap portion with the middle band from the limit-processed low-band component, and outputs the resulting component to the adder 220.

Similarly, the trimming filter unit 212 removes the overlap portion with the low band and the overlap portion with the high band from the limit-processed middle-band component, and outputs the resulting component to the adder 220.

The trimming filter unit 218 removes the overlap portion with the middle band from the limit-processed high-band component, and outputs the resulting component to the adder 220.

The adder 220 adds and combines the low-band component, the middle-band component, and the high-band component from the trimming filter units 206, 212, and 218, respectively, and outputs the combined signal.

Figure 3A:
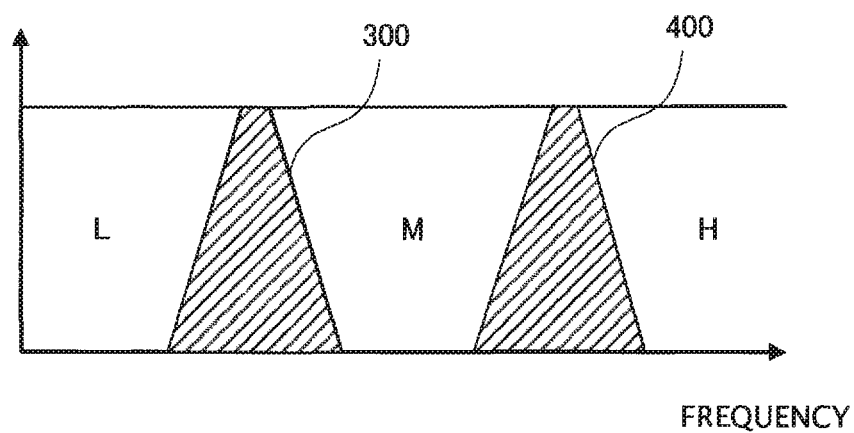
FIG. 3A is an explanatory diagram of a filter characteristic of a multi-band limiter according to an embodiment of the present disclosure.

FIGS. 3A-3D are characteristic diagrams of the multi-band limit process of the present embodiment. FIG. 3A shows a filter characteristic of the overlap filter unit 200. In a low-band filter (L), a middle-band filter (M), and a high-band filter (H) for respectively dividing the frequency bands to the low band, the middle band, and the high band, the low-band filter and the middle-band filter overlap each other at an overlap portion 300 shown with hatching, and the middle-band filter and the high-band filter overlap each other at an overlap portion 400 shown with a hatching. Thus, a signal component of the frequency band of the overlap portion 300 is extracted by the low-band filter and also by the middle-band filter, and a signal component of the frequency band of the overlap portion 400 is extracted by the middle-band filter and also by the high-band filter. When a cutoff frequency of the low-band filter is fLc, a low-band side cutoff frequency of the middle-band filter is fMLc, a high-band side cutoff frequency of the middle-band filter is fMHc, and a cutoff frequency of the high-band filter is fHc, in the overlap filter unit 200, the following relationship holds:

fMLc≤fLc
fHc≤fMHc.

More specifically, fMLc≤fLc<fHc≤fMHc.

Figure 3B:
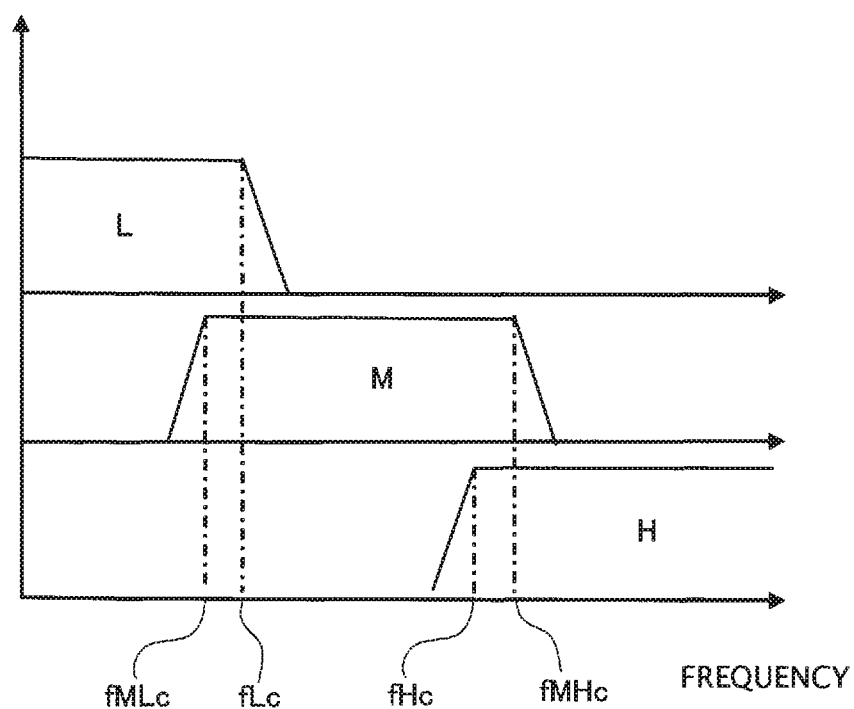
FIG. 3B is an explanatory diagram of a cutoff frequency of a multi-band limiter according to an embodiment of the present disclosure.

FIG. 3B shows in a separated manner frequency characteristics of the low-band filter (L), the middle-band filter (M), and the high-band filter (H) which are filter elements of the overlap filter unit 200. FIG. 3B also shows the size relationship of the cutoff frequencies of the filters. The low-band component is extracted by the low-band filter, the middle-band component is extracted by the middle-band filter, and the high-band component is extracted by the high-band filter. Control gains are determined in respective frequency bands, and a limit process is executed.

Figure 3C:
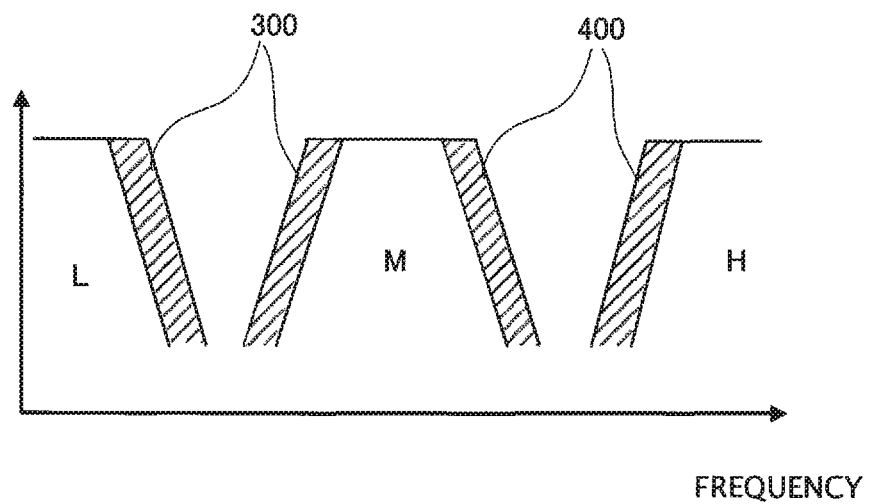
FIG. 3C is an explanatory diagram of a trimming filter of a multi-band limiter according to an embodiment of the present disclosure.

FIG. 3C schematically shows a removal process of the overlap portion 300 and the overlap portion 400 at the trimming filter units 206, 212, and 218. Looking at the low-band filter, of the components which are extracted and limit-processed, a component corresponding to the overlap portion 300 is removed by the trimming filter unit 206. Similarly, looking at the middle-band filter, of the components which are extracted and limit-processed, components corresponding to the overlap portions 300 and 400 are removed by the trimming filter unit 212, and looking at the high-band filter, of the components which are extracted and limit-processed, a component corresponding to the overlap portion 400 is removed by the trimming filter unit 218.

Figure 3D:
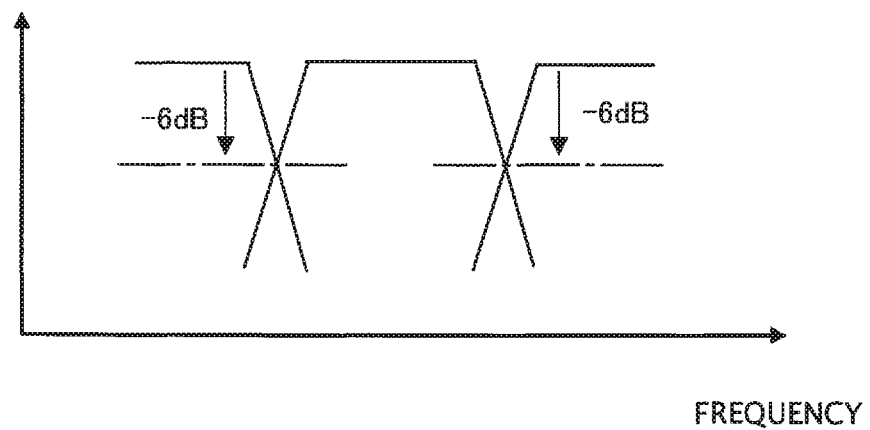
FIG. 3D is an explanatory diagram of a combining characteristic of a multi-band limiter according to an embodiment of the present disclosure.
Figure 4A:
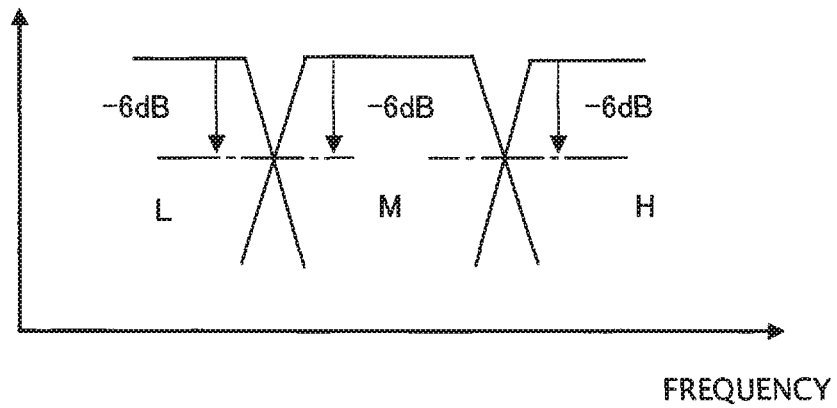
FIG. 4A is an explanatory diagram of a filter characteristic of a multi-band limiter according to the related art.
Figure 4B:
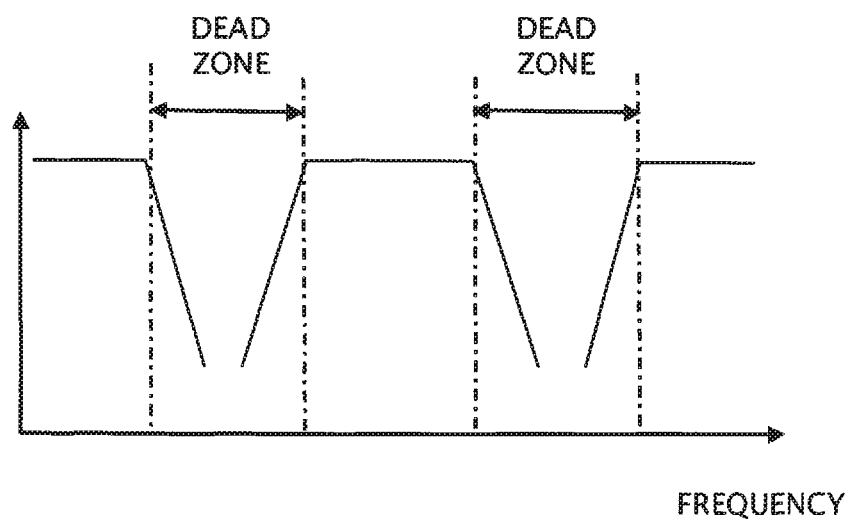
FIG. 4B is an explanatory diagram of a limiter characteristic of a multi-band limiter according to the related art.

FIG. 3D schematically shows the signal components which are trimming-processed by the trimming filter units 206, 212, and 218. The characteristic corresponds to a characteristic obtained by removing the overlap portions 300 and 400 from the filter characteristic of the overlap filter unit 200 shown in FIG. 3A. The characteristic is a characteristic of crossing at −6 dB, and by adding these components, a characteristic can be obtained in which the frequency characteristic is flat. In other words, the trimming filter units 206, 212, and 218 apply the trimming process in order to obtain the characteristic crossing with −6 dB.

As shown in FIGS. 3A-3D, in the present embodiment, the process flow differs from the process flow of the related art of:

Frequency band division (cross with −6 dB)→limit process for each band→combining, and the process flow is:

Frequency band division (overlap)→limit process for each band→trimming process (overlapped portion)→combining.

An embodiment of the present disclosure has been described. The present disclosure, however, is not limited to such a configuration, and various modifications may be made.

For example, in the present embodiment, the multi-band limit process is realized by the CPU 102 reading and executing a process program stored in the program memory, and the CPU 102 functions as the multi-band limiter. Alternatively, the function may be realized by a DSP or as a particular hardware circuit such as a digital filter circuit or the like. As the filter, the use of an FIR (Finite Impulse Response) filter which maintains the linearity of the phase characteristic is desirable, but the filter is not limited to such a filter. In place of storing the process program in a storage medium such as a flash memory in advance, the process program may be downloaded from a server via a network such as the Internet and stored in the memory of the sound recording apparatus. The process program may be provided as an application for sound recording, and in this case, the device that downloads and executes the application for sound recording does not need to be a dedicated sound recording apparatus, and may be an arbitrary portable information terminal such as, for example, a smartphone, which has a CPU, a memory, an input/output interface, and a communication interface.

Moreover, in the present embodiment, the CPLD 134 is required for the embedding process or the like, but when the sound is simply recorded, the CPLD 134 is not necessary.

In the present embodiment, the input sound is divided into three frequency bands; the low band, the middle band, and the high band, by the overlap filter unit 200. However, the present disclosure is not limited to such a configuration, and the input sound may be divided into two frequency bands, or four or more frequency bands.

The invention claimed is:

1. A multi-band limiter comprising:
a processor;
a memory coupled to the processor, the memory storing a program that, when executed by the processor, causes the processor to:
divide an input sound signal, using a first filter, into at least a first component which is of a relatively low band, and divide the input sound signal, using a second filter, into a second component which is of a relatively high band, wherein the first component and the second component overlap each other, and a high-band side cutoff frequency of the first filter is greater than or equal to a low-band side cutoff frequency of the second filter;
limit a level in each of the first component and the second component, and produce a limit-processed first component and a limit-processed second component;
trim an overlapping signal component in each of the limit-processed first component and the limit-processed second component, and produce a trim-processed first component and a trim-processed second component; and
combine the trim-processed first component and the trim-processed second component, and output the trim-processed first component and the trim-processed second component combined.

2. The multi-band limiter according to claim 1, wherein:
the program stored in the memory, when executed by the processor, causes the processor to:
divide the input sound signal, using a low-band filter, a middle-band filter, and a high-band filter, into a low-band component, a middle-band component, and a high-band component, respectively, wherein the low-band component and the middle-band component overlap each other and the middle-band component and the high-band component overlap each other, and a high-band side cutoff frequency of the low-band filter is greater than or equal to a low-band side cutoff frequency of the middle-band filter and a high-band side cutoff frequency of the middle-band filter is greater than or equal to a low-band side cutoff frequency of the high-band filter,
limit the level in each of the low-band component, the middle-band component, and the high-band component, and produce a limit-processed low-band component, a limit-processed middle-band component, and a limit-processed high-band component;
trim overlapping signal components in each of the limit-processed low-band component, the limit-processed middle-band component, and the limit-processed high-band component, and produce a trim-processed low-band component, a trim-processed middle-band component, and a trim-processed high-band component; and
combine the trim-processed low-band component, the trim-processed middle-band component, and the trim-processed high-band component, and output the trim-processed low-band component, the trim-processed middle-band component, and the trim-processed high-band component combined.

3. The multi-band limiter according to claim 1, wherein the trim-processed first component and the trim-processed second component, when plotted together on a graph indicating magnitude on a logarithmic scale versus frequency, cross each other at −6 dB.

4. The multi-band limiter according to claim 1, wherein the multi-band limiter is incorporated in a sound recording apparatus
that includes a recorder that records an output signal from the multi-band limiter.

5. A non-transitory computer-readable storage medium that stores a program which, when executed, causes a processor of a computer to:
divide an input sound signal, using a first filter, into at least a first component which is of a relatively low band, and divide the input sound signal, using a second filter, into a second component which is of a relatively high band, wherein the first component and the second component overlap each other, and a high-band side cutoff frequency of the first filter is greater than or equal to a low-band side cutoff frequency of the second filter;
limit a level in each of the first component and the second component, and produce a limit-processed first component and a limit-processed second component;
trim an overlapping signal component in each of the limit-processed first component and the limit-processed second component, and produce a trim-processed first component and a trim-processed second component; and
combine the trim-processed first component and the trim-processed second component, and output the trim-processed first component and the trim-processed second component combined.

* * * * *